US 007449924B2

(12) United States Patent
Vincent

(10) Patent No.: US 7,449,924 B2
(45) Date of Patent: Nov. 11, 2008

(54) LATCH-BASED SERIAL PORT OUTPUT BUFFER

(75) Inventor: William M. Vincent, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 665 days.

(21) Appl. No.: 10/942,219

(22) Filed: Sep. 16, 2004

(65) Prior Publication Data

US 2006/0055646 A1 Mar. 16, 2006

(51) Int. Cl.
*H03B 1/00* (2006.01)
*H03K 3/00* (2006.01)

(52) U.S. Cl. .................... 327/112; 327/108; 327/199

(58) Field of Classification Search .......... 327/197–20, 327/512, 513, 108, 112; 326/62, 83; 710/52, 710/62, 74; 365/189.05; 360/29, 48; 714/701, 714/718
See application file for complete search history.

(56) References Cited

U.S. PATENT DOCUMENTS

| 4,697,279 | A | | 9/1987 | Baratti et al. | |
|---|---|---|---|---|---|
| 4,906,870 | A | | 3/1990 | Gongwer | |
| 5,198,999 | A | * | 3/1993 | Abe et al. | 365/189.05 |
| 5,959,474 | A | * | 9/1999 | Park et al. | 327/112 |
| 5,983,314 | A | | 11/1999 | Merritt | |
| 6,307,417 | B1 | | 10/2001 | Proebsting | |
| 6,323,698 | B1 | | 11/2001 | Fletcher | |
| 6,567,318 | B2 | * | 5/2003 | Bedarida et al. | 365/189.05 |
| 6,715,115 | B1 | * | 3/2004 | Aikawa et al. | 714/718 |
| 7,075,742 | B2 | * | 7/2006 | Ehrlich | 360/29 |
| 7,095,262 | B2 | * | 8/2006 | Petersen et al. | 327/197 |
| 7,133,956 | B2 | | 11/2006 | Handa et al. | |
| 2002/0163924 | A1 | * | 11/2002 | Kim | 370/420 |
| 2004/0041594 | A1 | | 3/2004 | Kang et al. | |
| 2004/0136221 | A1 | | 7/2004 | Iwasaki | |
| 2006/0061395 | A1 | * | 3/2006 | Noto et al. | 327/108 |

FOREIGN PATENT DOCUMENTS

WO WO 2006033944 3/2006

* cited by examiner

*Primary Examiner*—Quan Tra
*Assistant Examiner*—Colleen O'Toole
(74) *Attorney, Agent, or Firm*—Tum Thach; Wade J. Brady, III; Frederick J. Telecky, Jr.

(57) ABSTRACT

An integrated circuit (22) having a serial interface (25) with improved access times is disclosed. The serial interface (25) includes a serial output port arranged as a shift register of flip-flop stages ($32_1$ through $32_n$) and a last output latch stage ($32_O$). The last output latch stage ($32_O$) includes an integral output buffer (33), and as such is constructed differently from the other output flip-flops ($32_1$ through $32_n$), which include master and slave latches. No external output buffer is then required; this last output latch stage ($32_O$) directly drives the output terminal and the external serial data line (SDATA).

9 Claims, 3 Drawing Sheets

LATCH-BASED SERIAL PORT OUTPUT BUFFER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to serial output ports in integrated circuits.

The communication of digital data over serial interfaces continues to be a viable technique in modern integrated circuits. Serial input/output ports are especially attractive for data communication between integrated circuits in which the number of external terminals must be limited, due to form factor or power concerns. A conventional serial port requires, at a minimum, only a single data terminal and a single clock terminal. In some cases, additional terminals may be devoted for an enable signal, and perhaps also for other control signals (e.g., a read/write signal indicating the direction of data flow). In any event, serial data communications are useful when "pin" count is a significant concern.

FIG. 1a illustrates a conventional application of serial data communications. In this example, controller 2 and device 4 communicate serially over serial data line SDATA. This serial communication is bidirectional (i.e., can travel either from controller 2 to device 4 or from device 4 to controller 2), and is synchronous with a serial clock signal communicated by controller 2 to device 4 on serial clock line SCLK. The direction of data flow is controlled, in this conventional example, by the state of a first serial bit communicated by controller 2 in a serial data word; alternatively, a read/write control signal may be communicated on a separate line from controller 2 to device 4. In the example of FIG. 1a, an enable control signal is also driven by controller 2 to device 4 on enable line SDEN, so that the serial port can be disabled when not in use.

The arrangement of FIG. 1a corresponds to the known application of a controller for a hard disk drive in a computer, in which controller 2 corresponds to a hard disk drive controller, and device 4 corresponds to a servo control integrated circuit for controlling the drive to a spindle motor and a voice coil motor of a hard disk drive system. Of course, this serial communication approach is also used in other applications besides disk drive control.

It has been observed, in connection with this invention, that the timing constraints on serial data communication can be quite severe, especially in serial communication for disk drive controllers. This timing is especially severe regarding the reading of serial data by controller 2 from device 4. In the example of FIG. 1a, controller 2 reads data from data line SDATA, via a buffer, into flip-flop 5.

As is fundamental in the art, conventional flip-flops, including flip-flop 5 of FIG. 1a, include two clocked latches, each clocked on opposite edges of the same clock signal. As such, the conventional flip-flop circuit is also referred to as a master-slave flip-flop, with the input latch operating as the master latch and the output latch slaved to that input, master, latch. As will become apparent from this description of conventional serial ports include input and output shift registers constructed of a sequence of flip-flops as the shift register stages.

FIG. 1b illustrates the timing of a conventional read operation in the operation of the serial port of FIG. 1a. The leading edge of clock SCLK controls the timing of this operation in this example. At time t0, the leading edge of serial clock SCLK is generated by controller 2 and applied to device 4, in response to which the serial port of device 4 initiates the process of presenting a data bit at data line SDATA. At time t1, device 4 presents a valid data bit D0 on data line SDATA; as such, the time duration $t_{ACC}$ between time t0 and time t1 is the access time for this read operation, and corresponds to the time required for device 4 to read data bit D0 from a register stage (as will be described below) and present the bit at data line SDATA. In this conventional arrangement of FIG. 1a, controller 2 expects to latch the data state on data line SDATA into flip-flop 5 upon the next leading edge of serial clock SCLK, which is at time t2 for data bit D0. This writing operation typically requires a "setup" time $t_{SU}$ at which the data state (data bit D0 in this example) is to be valid on data line SDATA prior to the edge of serial clock SCLK (time t2 in this example). This setup time allows sufficient propagation delay through the input buffer and physical conductors, so that controller 2 is assured that valid and settled data states are latched.

However, as the performance and speed of integrated circuits increase, and as the performance demands of systems such as computer hard disk drives also increase, higher data rate serial communications in implementations such as shown in FIGS. 1a and 1b are required. For example, serial clock (SCLK) rates for serial communications of on the order of 80 MHz are contemplated for state-of-the-art hard disk drive systems. For the example of this clock rate, the cycle time of serial clock SCLK will be about 13 nsec. The data setup time $t_{SU}$ in this instance is contemplated to be about 5 nsec according to modern technology, leaving device 4 only about 8 nsec to access and present valid data at data line SDATA.

FIG. 1c illustrates the construction of a conventional serial port 6 in device 4, such as a servo controller for a hard disk drive. As shown in FIG. 1c, serial port 6 includes an input side and an output side. On the input side, input buffer 7 has an input at a terminal connected to data line SDATA, and an output connected to the input of a first flip-flop stage $14_0$ of a sequence of flip-flops $14_0$ through $14_n$ arranged as a shift register. Each of input flip-flops 14 is clocked by serial clock SCLK, and advances its contents along the shift register with each cycle of serial clock SCLK. Flip-flops 14 together present their contents in parallel, for example to load a register within device 4. In operation, therefore, input data at data line SDATA is serially clocked into flip-flops 14 over a sequence of cycles of serial clock SCLK, and present their contents in parallel to the desired register.

Conversely, on the output side of serial port 6, a sequence of flip-flops $12_0$ through $12_n$ are also connected in sequence as a shift register. Flip-flops 12 are each also clocked by serial clock SCLK, and advance their contents toward output buffer 9 (in the direction from flip-flop $12_n$ toward flip-flop $12_0$). Output buffer 9 has its input connected to the output of last flip-flop $12_0$, and its output connected through the terminal to data line SDATA. Flip-flops 12 are also operable to receive their data in parallel, for example from a register within device 4. In operation, therefore, flip-flops 12 receive the contents of such a register, and serially output data bits of those contents in sequence, over a sequence of cycles of serial clock SCLK.

As shown in FIG. 1c, input buffer 7 and output buffer 9 also receive control signal I/O, which indicates whether input buffer 7 is to be enabled to receive data from data line SDATA or output buffer 9 is to drive data line SDATA in an output operation. Control signal I/O may be a separate control line in the serial port interface, or alternatively, as in the case of many modern disk drive control systems, control signal I/O is decoded by device 4 from a particular input bit or bits received on data line SDATA. In input mode (i.e., input buffer 7 enabled to receive serial data), output buffer 9 is placed by control signal I/O into a "tri-state", or high impedance, mode, in which the output of output buffer 9 floats. Conversely, in output mode (i.e., output buffer 9 is enabled), input buffer 7 is disabled from responding to data driven from output buffer 9, in the conventional manner.

Referring now to FIG. 1d, the construction of a conventional one of flip-flops 12 in the conventional serial port of FIG. 1c, specifically the construction of last flip-flop $12_0$ (having its output connected to the input of output buffer 9) will now be described, by way of further background. As shown in FIG. 1d, flip-flop $12_0$ includes master latch 16 including a pair of inverters 16a, 16b connected in series, and slave latch 18 including a pair of inverters 18a, 18b connected in series. As shown in FIG. 1d, the input of flip-flop $12_0$ on line IN is connected to the input of inverter 16a through switch 11, the output of inverter 16a is connected directly to the input of inverter 16b, and the output of inverter 16b is connected to the input of inverter 16a through switch 13. The output of inverter 16b is connected to the input of inverter 18a through switch 17, the output of inverter 18a is connected to the input of inverter 18b, and the output of inverter 18b is connected to the input of inverter 18a through switch 19. Switches 11 and 19 are controlled by serial clock SCLK, so as to be closed when serial clock SCLK is at a high level, and switches 13 and 17 are controlled by serial clock SCLK inverted, so as to be closed when serial clock SCLK is at a low level.

According to modern technology, inverters 16a, 16b, 18a, 18b are typically implemented by way of complementary metal-oxide-semiconductor (CMOS) inverters, and switches 11, 13, 17, 19 are typically implemented by way of conventional pass gates (typically CMOS pass gates of a p-channel MOS transistor in parallel with an n-channel MOS transistor, the gates of which receive complementary clock levels). Inverters 18a, 18b in slave latch 18 may be implemented by relative small devices (i.e., MOS devices with relatively small W/L ratios), as inverters 18a, 18b are required only to drive the input of the next CMOS stage within device 4. Output buffer 9, on the other hand, includes relatively large devices, as it must drive external data line SDATA and also the load (i.e., input impedance) of the serial port of controller 2 in this example.

In operation, the input state on line IN is written into flip-flop $12_0$ upon a falling edge of serial clock SCLK (at time t0 of FIG. 1b), as switch 11 closes and switches 13 and 17 open. The previous state of slave latch 18, at the output of flip-flop $12_0$ is latched into inverting buffers 18a, 18b by switch 19, which closes on the rising edge of serial clock SCLK, and this state is driven at the output of flip-flop $12_0$ to output buffer 9. Upon the rising edge of serial clock SCLK (at time t1 of FIG. 1b), switches 11 and 19 open, and switches 13 and 17 close. With switch 13 closed, the output of inverter 16b is applied to the input of inverter 16a so that the state from input line IN is stored by inverters 16a, 16b. This stored state is then forwarded to the input of inverter 18a through closed switch 17, and propagates through inverter 18a and inverter 18b to output buffer 9. This operation of flip-flop $12_0$ and output buffer 9 repeats with each cycle of serial clock SCLK.

It has been observed, in connection with this invention, that the propagation delay of flip-flop $12_0$ directly and adversely affects the access time $t_{ACC}$ and the setup time $t_{SU}$.

BRIEF SUMMARY OF THE INVENTION

It is therefore an object of this invention to provide a serial output port in which the latency time for the output of data is reduced.

It is a further object of this invention to provide such a serial output port that may be implemented with conventional circuitry and manufacturing technology.

It is a further object of this invention to provide a disk drive control system including such a serial output port.

Other objects and advantages of this invention will be apparent to those of ordinary skill in the art having reference to the following specification together with its drawings.

The present invention may be implemented into a serial output port, such as may be implemented into a control circuit for a computer disk drive system. The serial output port includes a sequence of flip-flop stages, arranged as a shift register and clocked in response to a serial clock. The last stage, which drives the serial output port, includes a latched buffer as its output stage, and directly drives the serial output port. The external output buffer that conventionally follows the last shift register stage can thus be eliminated.

BRIEF DESCRIPTION OF THE SEVERAL VIEWS OF THE DRAWING

FIG. 1b is a timing diagram illustrating the operation of the serial communication in the conventional system of FIG. 1a.

DETAILED DESCRIPTION OF THE INVENTION

The present invention will be described in connection with its preferred embodiment, namely as implemented into a control circuit for a system such as a hard disk drive system, because this invention is contemplated to be of particular benefit in that application. However, it is also contemplated that this invention may provide significant benefit in many other applications, including those applications in which serial data communication is to be optimized. Accordingly, it is to be understood that the following description is provided by way of example only, and is not intended to limit the true scope of this invention as claimed.

Figure 2:
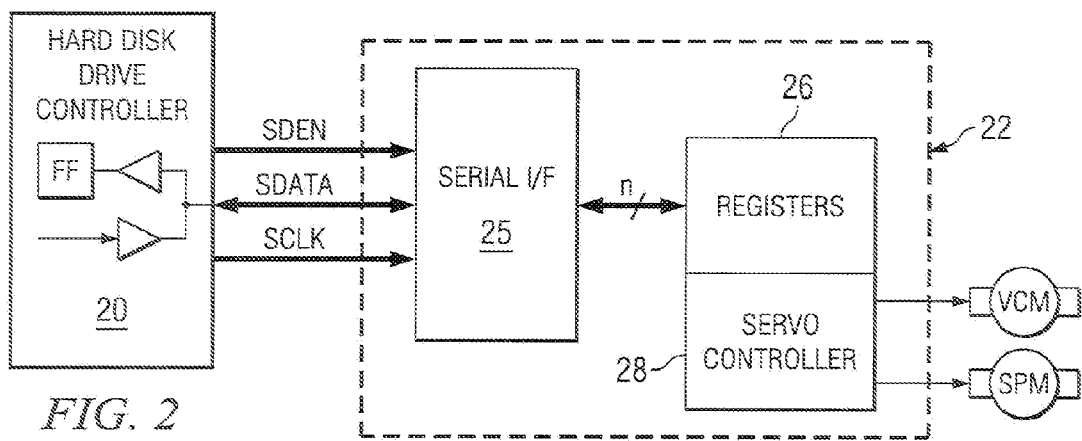
FIG. 2 is an electrical diagram, in block form, of a control system for a hard disk drive system, constructed according to the preferred embodiment of the invention.

Referring now to FIG. 2, a hard disk drive control system constructed according to the preferred embodiment of the invention will now be described. As mentioned above, this system implementation of the preferred embodiment of the invention is presented by way of example only. However, the problem addressed by this invention arose in the context of data communication in a hard disk drive system because of its stringent performance requirements, and as such it is believed that this invention will be especially beneficial in such an application.

In the system of FIG. 2, hard disk drive controller 20 is connected to disk drive servo integrated circuit 22 by way of a serial data connection, among other connections (not shown). Servo integrated circuit 22 in turn forwards control signals to and receives status signals from spindle motor SPM and voice coil motor VCM. As well-known in the art, spindle motor SPM rotates the spindle of the magnetic disks in the disk drive, while voice coil motor VCM positions an actuator arm on which the read/write heads are disposed. In this example, servo integrated circuit 22 includes serial interface 25, which serially communicates with hard disk drive controller 20 over the serial data connection as will be described in further detail below. Serial interface 25 interfaces register bank 26 to hard disk drive controller 20. Register bank 26 includes a plurality of registers that store control information used by servo controller 28 to control voice coil motor VCM and spindle motor SPM, and that receive and store status information from servo controller 28.

In operation, hard disk drive controller 20 writes control information, over the serial data connection via serial interface 25, to registers in register bank 26 to control voice coil motor VCM and spindle motor SPM, and reads status information, also over the serial data connection via serial interface 25, from register bank 26 regarding the status of voice coil motor VCM and spindle motor SPM. Examples of the control information include data words to set the rotational speed of spindle motor SPM, control bits to define the operation of spindle motor SPM and voice coil motor VCM, various counters for controlling these motors, and the like. Status information that is readable by hard disk drive controller from register bank 26 include thermal shutdown and warning indicators, various failure indicators, and operating phase status of the spindle motor SPM and voice coil motor VCM.

In the example shown in FIG. 2, the serial data connection includes several lines, or conductors, running between hard disk drive controller 20 and servo integrated circuit 22; for purposes of this description, the lines and the signals they carry will be referred to by the same reference (SDEN, SCLK, SDATA). As shown, the serial data connection includes serial clock SCLK, serial port enable control signal SDEN, and bidirectional serial data line SDATA. In the conventional manner, hard disk drive controller 20 enables serial communication by driving an active level on serial port enable control line SDEN, with serial data transfer over serial data line SDATA synchronous with the serial clock issued by hard disk drive controller 20 on serial clock line SCLK. Also in this example, the address of a register in register bank 26 is communicated serially, by way of a register address that is serially communicated by hard disk drive controller 20 over serial data line SDATA; the direction in which data transfer is to be effected is indicated by one bit in the serial address value (e.g., the first address bit). Typically, the register address (and read/write control bit) is communicated in a specified number (e.g., eight) of serial clock SCLK cycles following a rising edge of serial port enable control signal SDEN, again with the first bit indicating a read (data driven by servo integrated circuit 22 onto serial data line SDATA) or write (data driven by hard disk drive controller onto serial data line SDATA).

Figure 3:
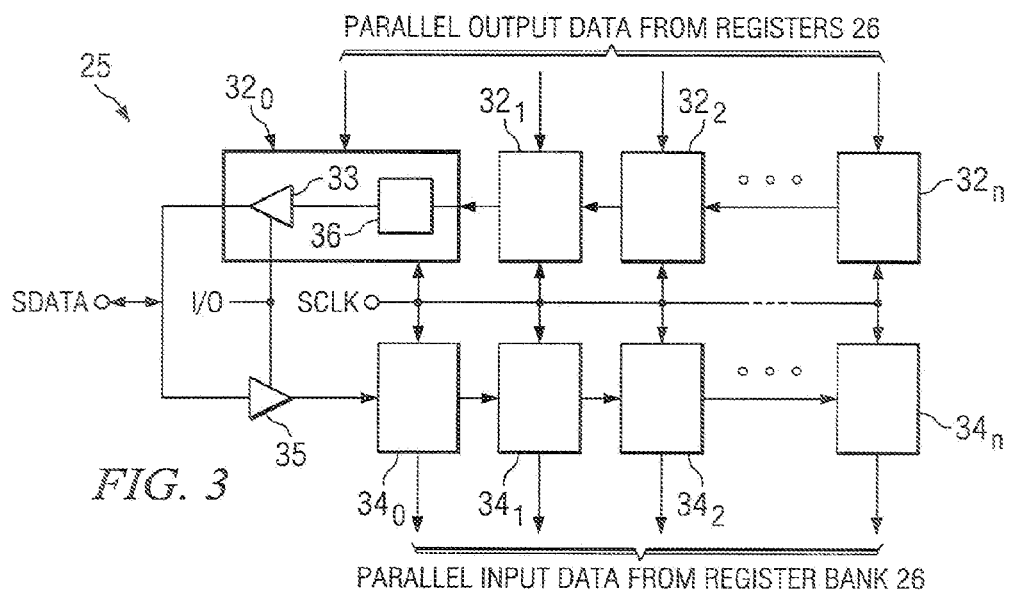
FIG. 3 is an electrical diagram, in block form, of a serial port constructed according to the preferred embodiment of the invention.

Referring now to FIG. 3, the construction and operation of serial interface 25 in servo integrated circuit 22 according to this preferred embodiment of the invention will now be described in detail. On the input side, input buffer 35 has its input connected to a terminal that receives serial data line SDATA. The output of input buffer 35 is connected to an input of first input latch $34_0$, which is in a series of input flip-flops $34_0$ through $34_n$ that are each clocked by serial clock SCLK, and operate as a shift register. Input flip-flops $34_0$ through $34_n$ present their output data in parallel, for example to select a register in register bank 26 and to forward the read/write signal (in the case of the first serial data word after control line SDEN is driven high), or to forward a data word to the selected register in register bank 26.

On the output side, a series of output stages including last output latch $32_0$ and flip-flops $32_1$ through $32_n$ receive respective bits, in parallel, from one of the registers in register bank 26. Last output latch $32_0$ and output flip-flops $32_1$ through $32_n$ are all clocked by serial clock SCLK, and are connected in shift register fashion, with the input of last output latch $32_0$ receiving the output of output flip-flop $32_1$ each cycle, the input of output flip-flop $32_1$ receiving the output of output flip-flop $32_2$ each cycle, and so on to the first output flip-flop $32_n$ in the sequence. In this example, each of output flip-flop $32_1$ through $32_n$ are constructed in the conventional manner, for example as described above relative to FIG. 1d.

Figure 1A:
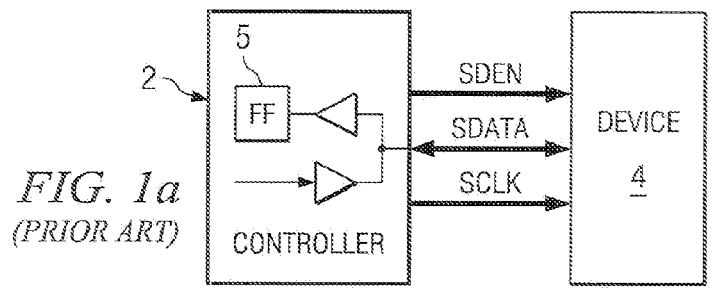
FIG. 1a is an electrical diagram, in block form, of a conventional control system including serial communication between its integrated circuits.
Figure 1B:
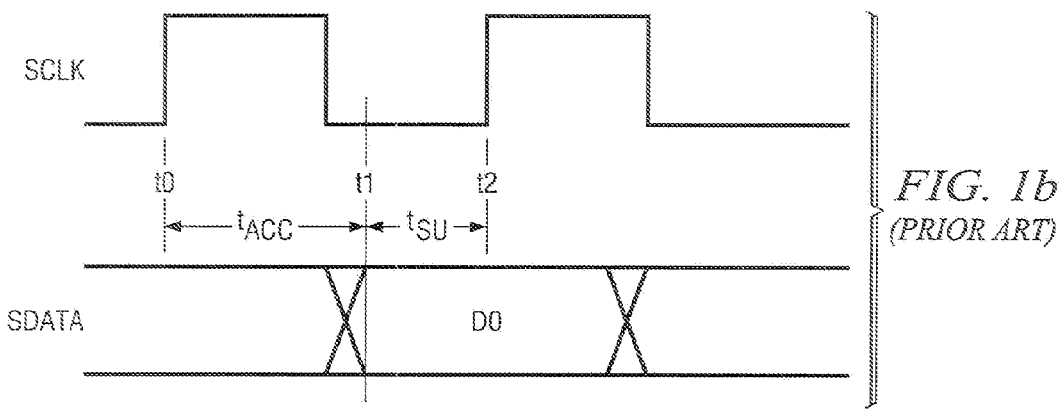
Figure 1C:
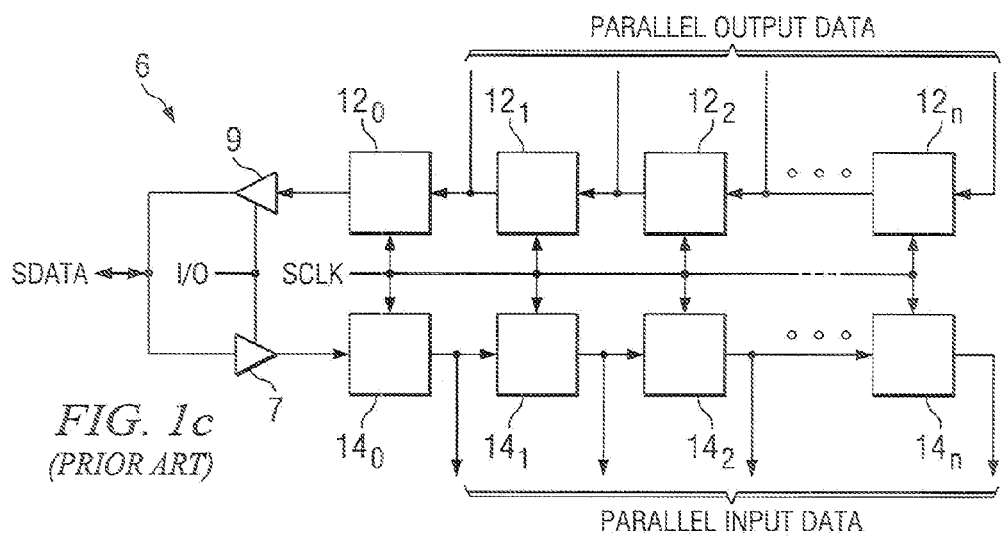
FIGS. 1c and 1d are electrical diagrams, in block and schematic form, of a conventional serial port and a latch within that serial port.

Similarly as in the conventional serial port interface of FIG. 1c, input buffer 35 and output buffer 33 in last output latch $32_0$ receive control signal I/O, which indicates whether input buffer 35 is to be enabled to receive data from data line SDATA or output buffer 33 is to drive data line SDATA in an output operation. Control signal I/O may be a separate control line in the serial port interface, or alternatively, as in the case of many modern disk drive control systems, control signal I/O is decoded from a particular input bit or bits received on data line SDATA. In input mode (i.e., input buffer 35 enabled to receive serial data), output buffer 33 is placed by control signal I/O into a "tri-state", or high impedance, mode, in which the output of output buffer 33 floats. Conversely, in output mode (i.e., output buffer 33 is enabled), input buffer 35 is disabled from responding to data driven from output buffer 33, in the conventional manner. The construction of last output latch stage $32_0$, including its ability to be placed into tristate, will be described in further detail below.

Figure 4:
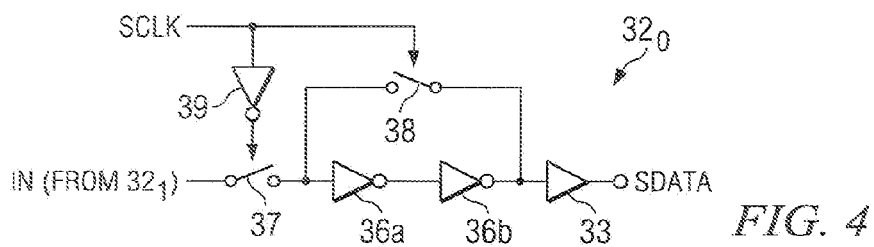
FIG. 4 is an electrical diagram, in block and schematic form, of a final stage output latch in the serial port of FIG. 3, according to the preferred embodiment of the invention.
Figure 5:
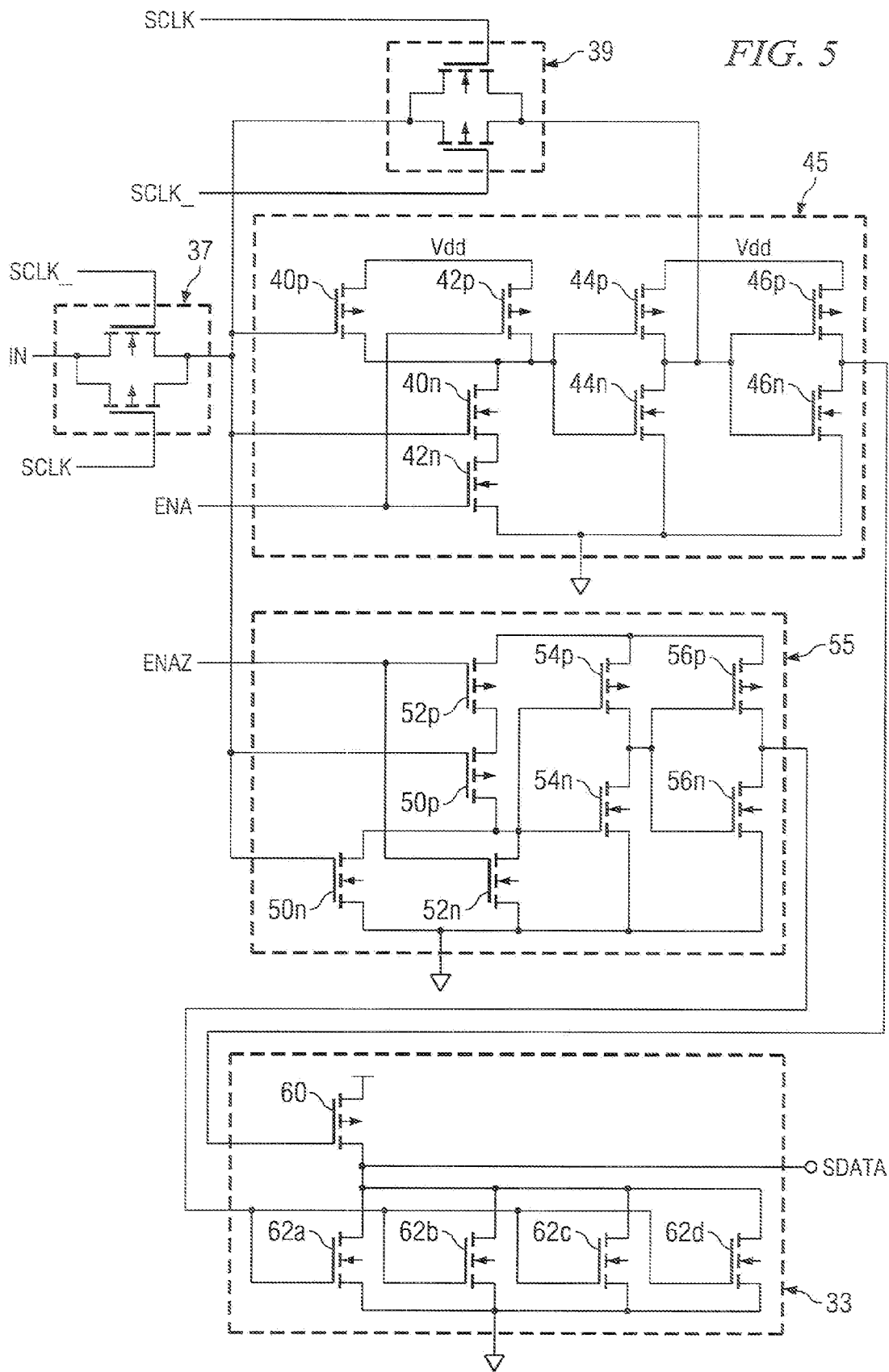
FIG. 5 is an electrical diagram, in schematic form, of the final stage output latch of FIG. 4, according to the preferred embodiment of the invention.

According to the preferred embodiment of the invention, last output latch $32_0$ is not constructed in the conventional manner, nor in the same manner as the other output stages, namely flip-flops $32_1$ through $32_n$ in the output shift register of serial interface 25. Rather, last output latch $32_0$ includes latch 36 and also output buffer 33. Output buffer 33 effectively replaces the slave latch from output latch $32_0$ that is present in each stage of the conventional serial interface, and that is present in the other output flip-flops $32_1$ through $32_n$ in serial interface 25. Referring now to FIGS. 4 and 5, the construction of last output latch $32_0$ will now be described in further detail.

FIG. 4 illustrates the construction of last output latch $32_0$ at a gate level. As shown in FIG. 4, the input of last output latch $32_0$ on line IN, driven from next output latch $32_1$ in the sequence, is received at switch 37. Switch 37 is clocked by the inverted state of serial clock SCLK via inverter 39, and is closed when serial clock SCLK is at a low level. The opposite side of switch 37 is connected to the input of inverter 36a, the output of which is connected to the input of inverter 36b. The output of inverter 36b is connected, via switch 38, to the input of inverter 36a. Switch 38 is controlled by serial clock SCLK (non-inverted), so that switch 38 is closed with serial clock SCLK at a high level. As such, switch 38 is closed when switch 37 is open, and vice versa. In operation, therefore, a trailing edge of serial clock SCLK causes switch 37 to close, and the logic state on line IN is forwarded to inverters 36a, 36b in turn; on the trailing edge of serial clock SCLK, this state is then latched by the connection, through closed switch 38, of the output of inverter 36b back to the input of inverter 36a. Inverters 36a, 36b, together with switches 37, 39, correspond to master latch 36 of FIG. 3.

In last output latch $32_0$ according to this preferred embodiment of the invention, the output of inverter 36b is connected directly to output buffer 33. As will be described in further detail below, output buffer 33 is a non-inverting buffer with substantial drive capability, for driving the external terminal of servo integrated circuit 22 that is connected to serial data line SDATA with a logic level corresponding to the output of inverter 36b. The size of devices within output buffer 33 therefore must be sized substantially larger than those in the buffers of flip-flops $32_1$ through $32_n$, so as to be capable of driving serial data line SDATA and the input impedance of controller 20 in this example. Accordingly, comparing the construction of last output latch $32_0$ with the conventional construction of flip-flop $12_0$ and output buffer 9 shown in FIG. 1d, the entire slave latch 18 of inverters 18a, 18b is eliminated, and the propagation delay through that latch stage is also eliminated.

FIG. 5 illustrates, at the transistor level, the construction of last output latch $32_0$ according to the preferred embodiment of the invention. As will be evident from this description, CMOS technology is used to implement this exemplary construction of last output latch $32_0$. It is contemplated, however, that those skilled in the art having reference to this specification will be readily able to construct last output latch $32_0$ utilizing the appropriate transistor technology available or desirable for each particular application.

In this preferred embodiment of the invention using CMOS technology, output buffer 33 is implemented as a push-pull output driver having a tri-state (high impedance output) capability considering that output buffer 33 drives a common input/output terminal (and therefore must be placed in its high-Z state to avoid crowbar current, or pin contention). P-channel output drive transistor 60 has its source biased to the power supply voltage $V_{dd}$, and its drain connected, at the output of output buffer 33, to the drains of n-channel output drive transistors 62a through 62d (each having their sources at ground). Of course, while four n-channel pull-down output drive transistors 62 are shown, it is contemplated that more or fewer such devices may be used. But in any case, the sizes of p-channel output drive transistor 60, and the sizes and numbers of n-channel output drive transistors 62a through 62d must be selected to directly drive line SDATA and the input load of the downstream device (e.g., controller 20). The gate of p-channel output drive transistor 60 is driven by upper latch stage 45, and the gates of n-channel output drive transistors are driven by lower latch stage 55. The combination of upper latch stage 45 and lower latch stage 55 correspond to a latch stage, and operate in complementary fashion As shown in FIG. 5, input line IN is applied to switch 37, which in this example is constructed as a conventional CMOS pass gate, including a p-channel MOS transistor and an n-channel MOS transistor having their source/drain paths connected in parallel, and their gates receiving serial clock SCLK and inverted serial clock SCLK_, respectively. The opposite side of switch 37 is applied to the gates of devices in upper and lower latch stages 45, 55.

In upper latch stage 45, p-channel transistors 40p, 42p have their sources connected to the power supply voltage $V_{dd}$ and their drains connected together. The gate of transistor 40p is connected to switch 37 to receive the input state, and the gate of transistor 42p is connected to enable line ENA (which corresponds to a signal derived from control signal I/O shown in FIG. 3, or the like). In this example, the drain of n-channel transistor is connected to the drains of p-channel transistors 40p, 40n, and the source/drain path of n-channel transistor 40n is connected in series with the source/drain path of n-channel transistor 42n between this node and ground. The gate of n-channel transistor 40n receives the input state from switch 37, and the gate of n-channel transistor 42n receives enable line ENA. Also in upper latch stage 45, the node at the drains of transistors 40p, 42p, 40n is connected to the gates of p-channel transistor 44p and n-channel transistor 44n; p-channel transistor 44p has its source at power supply voltage $V_{dd}$, n-channel transistor 44n has its source at ground, and the drains of transistors 44p, 44n are connected together. This node at the drains of transistors 44p, 44n is connected to one side of switch 39, and to the gates of p-channel transistor 46p and n-channel transistor 46n. P-channel transistor 46p has its source at power supply $V_{dd}$, n-channel transistor 46n has its source at ground, and the drains of transistors 46p, 46n are connected together to drive the gate of p-channel output drive transistor 60.

As mentioned above, the gates of n-channel output drive transistors 62a through 62d are driven by lower latch stage 55, which includes p-channel transistor 52p with its source at power supply voltage $V_{dd}$ and its gate receiving enable line ENAZ (which is also a signal derived from control signal I/O of FIG. 3, or the like). P-channel transistor 50p has its source connected to the drain of transistor 52p, and its gate connected to switch 37 to receive the input state. The drain of transistor 50p is connected to the drains of transistors 50n, 52n, each of which have their sources at ground and their gates receiving the input state from switch 37, and line ENAZ, respectively. The drains of transistors 50p, 50n, 52n are connected to the gates of p-channel transistor 54p and n-channel transistor 52n; the source/drain paths of transistors 54p, 54n are connected in series between power supply voltage $V_{dd}$ and ground. The drains of transistors 54p, 54n are connected to the gates of p-channel transistor 56p and n-channel transistor 56n, which also have their source/drain paths connected in series between power supply voltage $V_{dd}$ and ground. The drains of transistors 56p, 56n are connected together, to drive the gates of output drive transistors 62a through 62d.

Switch 39 is constructed as a conventional CMOS pass gate, with a p-channel having its source/drain path connected in parallel with that of an n-channel transistor between the drains of transistors 44p, 44n, on one side, and the gates of transistors 40p, 40n, 50p, 50n, on the other side. The gates of the p-channel transistor and the n-channel transistor in switch 39 receive inverted serial clock CLK_ and serial clock SCLK, respectively. Switch 39 thus effects the cross-coupling of the CMOS inverter of transistors 44p, 44n in upper latch stage 45 to the CMOS inverters of transistors 40p, 40n in upper latch stage 45 and of transistors 50p, 50n in lower latch stage 55. This cross-coupling is effected following the trailing edge of serial clock SCLK, during such time as switch 37 is over.

In operation, the high-impedance state of last output latch $32_0$ is effected by enable line ENA driven low and enable line ENAZ driven high (i.e., corresponding to control signal I/O of FIG. 3 indicating input mode, enabling input buffer 35). In upper latch stage 45, this low level on line ENA turns on transistor 42p (and turns off transistor 42n, to render the state of transistor 40n irrelevant), which presents a high logic level to the inverter of transistors 44p, 44n, which presents a low logic level to the inverter of transistors 46p, 46n, and which in turn drives a high logic level at the gate of p-channel output drive transistor 60, turning it off. In lower latch stage 55, the high level on line ENAZ turns on transistor 52n (turning off transistor 52p, to render the state of transistor 50p irrelevant), which presents a low logic level to the inverter of transistors 54p, 54n. The inverter of transistors 54p, 54n receives this low logic level and drives a high logic level to inverter of transistors 56p, 56n, which in turn drives a low level to the gates of n-channel output transistors 62a through 62d, turning them off. With transistor 60 and transistors 62a through 62d all in the off state, last output latch $32_O$ is not driving its output to any state (i.e., the terminal is in a high-impedance state); this permits the level of line SDATA to be driven by hard disk drive controller 20, and for input buffer 35 to receive digital data corresponding to that level.

In output mode (i.e., corresponding to control signal I/O of FIG. 3 indicating that output buffer 33 is to be enabled), where last output latch $32_O$ is to drive serial data line SDATA, enable line ENA is driven high and enable line ENAZ is driven low. In upper latch stage 45, the high level on line ENA turns off transistor 42p and turns on transistor 42n, permitting transistors 40p, 40n to control the state of the node at the drains of transistors 40p, 40n. Similarly, in lower latch stage 55, the low level on line ENAZ turns on transistor 52p and turns off transistor 52n, permitting transistors 50p, 50n to control the level at their drain node.

In this mode, the state of last output latch $32_O$ is determined by the state at its input on line IN and at least one cycle of serial clock SCLK. Upon the rising edge of serial clock SCLK, switch 37 connects input line IN to the gates of transistors 40p, 40n in upper latch stage 45, which drives a voltage at the drain of transistors 40p, 40n to the opposite logic level from that at input line IN. Switch 39 is held open during this half-cycle of serial clock SCLK. The level at input line IN propagates through the inverter of transistors 44p, 44n, and the inverter of transistors 46p, 46n, to the gate of output drive transistor 60 in output buffer 33. In short, a high logic level on line IN will result in a low logic level at the gate of p-channel output drive transistor 60, turning it on, pulling line SDATA high toward power supply voltage $V_{dd}$; conversely, a low logic level on line IN will result in a high logic level at the gate of p-channel output drive transistor 60, turning it off and permitting n-channel output drive transistors 62 to pull line SDATA low toward ground.

Similarly, in lower latch stage 55, upon a rising edge of serial clock SCLK, switch 37 connects input line IN to the gates of transistors 50p, 50n. The logic level on input line IN propagates through the inverter of transistors 50p, 50n, the inverter of transistors 54p, 54n, and the inverter of transistors 56p, 56n, to the gates of output drive transistors 62a through 62d in output buffer 33. In this case, a high logic level on line IN will result in a low logic level at the gates of n-channel output drive transistors 62a through 62d, turning them off and permitting p-channel output drive transistor 60 to pull line SDATA high toward power supply voltage $V_{dd}$. Conversely, a low logic level on line IN will result in a high logic level at the gates of p-channel output drive transistors 62a through 62d, turning them on, and pulling line SDATA low toward ground.

Upon the rising edge of serial clock SCLK, switch 37 closes, and switch 39 opens. The drains of transistors 44p, 44n then drive the gates of transistors 40p, 40n, and transistors 50p, 50n. This latches the current state of last output latch $32_O$ during the second half-cycle of serial clock SCLK, and continues the drive of the gates of transistors 60, 62 in output buffer 33 as before.

Figure 1D:
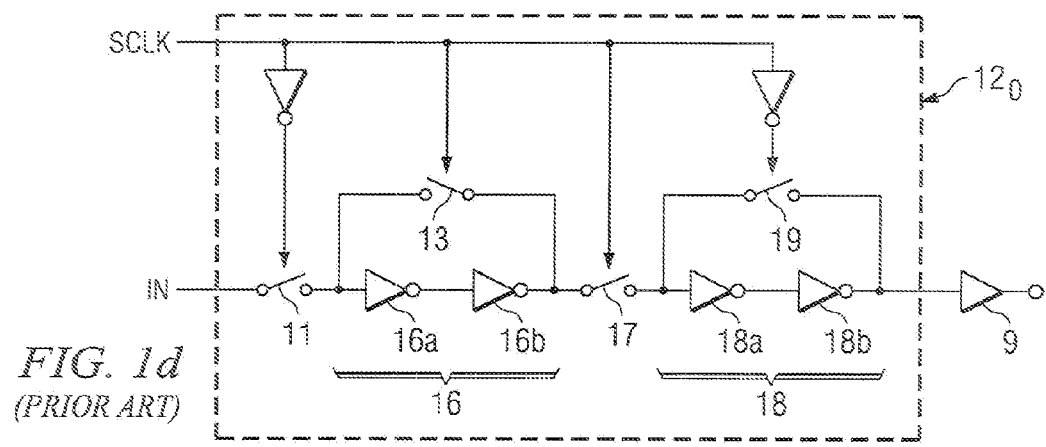

As evident from the construction of last output latch $32_O$ in FIGS. 4 and 5, the propagation of the logic level at line IN to the output terminal connected to line SDATA is significantly faster than in conventional shift register stages (for example, as shown in FIGS. 1c and 1d. This faster propagation results from the incorporation of the output buffer (output buffer 33 of FIGS. 3 through 5) into last output latch $32_O$, which permits the elimination of at least two inverting stages relative to conventional latch stages.

As a result, last output latch $32_O$ is able to present its output state sooner. In the system example of FIG. 2, in which last output latch $32_O$ is incorporated into serial interface 25 of servo integrated circuit 22, the access time of serial data on line SDATA to hard disk drive controller 20, relative to the leading edge of serial clock SCLK, is significantly reduced. It has been observed, by way of simulation and also in actual silicon implementation of this invention, that the access time $t_{ACC}$ is reduced by this invention by as much as 2 nsec. Considering that the period of a 80 MHz serial clock SCLK is only about 13 nsec, this improvement in access time is quite significant. But in the system application of FIG. 2, the improved access time provides additional margin in the setup time $t_{SU}$ of valid data on data line SDATA prior to the next rising edge of serial clock SCLK. This additional margin ensures stability in the communication of serial data between these two system devices, and can also enable further performance improvement by increasing the clock rate of serial clock SCLK even further.

It is contemplated that those skilled in the art having reference to this specification will recognize various alternative implementation details of this invention, and will also envision alternative and additional uses of this invention, in which the benefits of this invention can be attained. It is contemplated that those alternatives and additional implementations will be within the scope of this invention.

Therefore, while the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A serial output port, comprising:
  a plurality of flip-flop stages, connected in series with one another, and clocked by a serial clock signal;
  a last output latch stage, having an input connected to an output of a last one of the plurality of flip-flop stages, and comprising:
    (a) a latch, having an input and an output, for latching a stored state responsive to the serial clock signal;
    (b) an input switch, having a conduction path connected to an input of the last output latch stage, and clocked by the serial clock signal;
    (c) a delay element comprising a first pair of inverters having an input coupled to the input switch;
    (d) a cross-coupling switch, having a conduction path connected between an output of the delay element and an input of the delay element, and having a control terminal coupled to the serial clock signal, for connecting the output of the delay element to the input of the delay element while the input switch is open;
    (e) an output buffer coupled to the delay element, having an input connected to the output of the latch, and having an output connected to an external terminal of the serial output port; the output buffer comprising:
      a pull-up transistor, having a conduction path connected between a power supply node and the external terminal, and having a control terminal coupled to an output of the latch and to the output of the first pair of inverters; and at least one pull-down transistor, having a conduction path connected between the external terminal and a reference voltage node, and having a control terminal coupled to the output of the latch;

wherein the latch of the last output latch stage further comprises:

(f) a second pair of inverters, having an input coupled to the input switch and an output coupled to the control terminal of the at least one pull-down transistor; and (g) enable circuitry, having an input receiving an enable/disable signal, and for forcing the first pair of inverters to an output state that turns off the pull-up transistor and for forcing the second pair of inverters to an output state that turns off the at least one pull-down transistor, both responsive to the enable/disable signal in a disable state.

2. The serial output port of claim 1, wherein the at least one pull-down transistor comprises a plurality of pull-down transistors having their conduction paths connected in parallel with one another.

3. The serial output port of claim 1, wherein the cross-coupling switch is also for connecting the output of the second pair of inverters to the input of the second pair of inverters while the input switch is open.

4. An integrated circuit having a serial port comprising:

at least one register;

a serial output port, including:

a plurality of output flip-flop stages, connected in series with one another, and clocked by a serial clock signal, each having an input coupled to receive a bit from the at least one register;

a last output latch stage, having an input connected to an output of a last one of the plurality of flip-flop stages, and comprising:

(a) a latch, having an input and an output, for latching a stored state responsive to the serial clock signal;

(b) an input switch, having a conduction path connected to an input of the last output latch stage, and clocked by the serial clock signal;

(c) a delay element comprising a first pair of inverters having an input coupled to the input switch;

(d) a cross-coupling switch, having a conduction path connected between an output of the delay element and an input of the delay element, and having a control terminal coupled to the serial clock signal, for connecting the output of the delay element to the input of the delay element while the input switch is open;

(e) an output buffer coupled to the delay element, having an input connected to the output of the latch, and having an output connected to an external terminal of the serial output port; the output buffer comprising:

a pull-up transistor, having a conduction path connected between a power supply node and the external terminal, and having a control terminal coupled to an output of the latch and to the output of the first pair of inverters; and at least one pull-down transistor, having a conduction path connected between the external terminal and a reference voltage node, and having a control terminal coupled to the output of the latch;

wherein the latch of the last output latch stage farther comprises:

(f) a second pair of inverters, having an input coupled to the input switch and an output coupled to the control terminal of the at least one pull-down transistor; and (g) enable circuitry, having an input receiving an enable/disable signal, and for forcing the first pair of inverters to an output state that turns off the pull-up transistor and for forcing the second pair of inverters to an output state that turns off the at least one pull-down transistor, both responsive to the enable/disable signal in a disable state.

5. The integrated circuit of claim 4, further comprising:

a serial input port, comprising:

an input buffer; and a plurality of input flip-flop stages connected in series with one another, the first input flip-flop stage having an input connected to an output of the input buffer, and the others of the plurality of input flip-flop stages having an input connected to an output of the preceding input flip-flop stage in the series, each of the plurality of input flip-flop stages having an output coupled to the at least one register.

6. The integrated circuit of claim 4, wherein the serial output port further comprises:

circuitry for placing the output of the output buffer into a high-impedance state responsive to an enable/disable signal at a disable state.

7. The integrated circuit of claim 4, wherein the at least one pull-down transistor comprises a plurality of pull-down transistors having their conduction paths connected in parallel with one another.

8. The integrated circuit of claim 4, wherein the cross-coupling switch is also for connecting the output of the second pair of inverters to the input of the second pair of inverters while the input switch is open.

9. The integrated circuit of claim 4, further comprising:

a servo controller, coupled to the at least one register, for generating control signals for a spindle motor and a voice coil motor of a hard disk drive.

* * * * *